United States Patent
Spadari et al.

(10) Patent No.: US 7,606,692 B2
(45) Date of Patent: Oct. 20, 2009

(54) GATE-LEVEL NETLIST REDUCTION FOR SIMULATING TARGET MODULES OF A DESIGN

(75) Inventors: Maurizio Spadari, Bologna (IT); Stefano Commodaro, Milan (IT)

(73) Assignee: LSI Corporation, Milpitas, CA (US)

( * ) Notice: Subject to any disclaimer, the term of this patent is extended or adjusted under 35 U.S.C. 154(b) by 730 days.

(21) Appl. No.: 10/832,226

(22) Filed: Apr. 26, 2004

(65) Prior Publication Data

US 2005/0240387 A1    Oct. 27, 2005

(51) Int. Cl.
    *G06F 17/50*    (2006.01)
(52) U.S. Cl. ............................................. 703/14; 716/2
(58) Field of Classification Search ................... 703/14, 703/15, 19; 716/2, 8, 18; 326/10
See application file for complete search history.

(56) References Cited

U.S. PATENT DOCUMENTS

| 6,374,205 | B1 * | 4/2002 | Kuribayashi et al. | 703/14 |
| 6,496,972 | B1 * | 12/2002 | Segal | 716/18 |
| 6,510,541 | B1 * | 1/2003 | Fujiwara et al. | 716/5 |
| 6,574,778 | B2 | 6/2003 | Chang et al. | 716/1 |
| 6,928,630 | B2 * | 8/2005 | Moon et al. | 716/6 |
| 6,978,431 | B2 * | 12/2005 | Hirakimoto et al. | 716/10 |
| 7,103,863 | B2 * | 9/2006 | Riepe et al. | 716/7 |
| 7,424,418 | B1 * | 9/2008 | Soufi et al. | 703/14 |

* cited by examiner

*Primary Examiner*—Paul L Rodriguez
*Assistant Examiner*—Juan C Ochoa
(74) *Attorney, Agent, or Firm*—Christopher P. Maiorana, PC (57) ABSTRACT

A method for analyzing a circuit design in preparation for a simulation. The method generally includes the steps of (A) marking each of a plurality of modules between a target module of the modules and a top module of the modules in a hierarchy of the circuit design as a first type by traversing upward through the hierarchy starting from the target module, (B) marking each of the modules as a second type where a parent module of the modules is marked as the first type by traversing downward through the hierarchy starting from the top module and (C) marking each of the modules as a third type where the parent module is not marked as the keep type by traversing downward through the hierarchy starting from the top module.

21 Claims, 6 Drawing Sheets

GATE-LEVEL NETLIST REDUCTION FOR SIMULATING TARGET MODULES OF A DESIGN

FIELD OF THE INVENTION

The present invention relates to circuit design simulation generally and, more particularly, to a method for gate-level netlist reduction for simulating target modules of a design.

BACKGROUND OF THE INVENTION

The electronic industry is currently dealing with increasingly larger application specific integrated circuit (ASIC) products. A digital simulation of an entire ASIC design imposes a significant burden in terms of central processing unit (CPU) time and hardware resources (i.e., workstation memory). Even if a small portion of the ASIC circuit is simulated, an electronic design automation (EDA) simulator consumes significant hardware resources and CPU time loading the gate-level netlist and back-annotating the design with timing data. A typical example situation is the validation of a test program that addresses a specific module of the ASIC, such as a built-in self test (BIST) pattern for a block of the ASIC design or a memory-BIST pattern for a specific set of memories.

SUMMARY OF THE INVENTION

The present invention concerns a method and/or architecture for analyzing a circuit design in preparation for a simulation of a test pattern and reducing the design simulation database by automatically removing all elements not useful for the target test pattern. The method generally comprises the steps of (A) marking each of a plurality of modules between a target module of the modules and a top module of the modules in a hierarchy of the circuit design as a first type by traversing upward through the hierarchy starting from the target module, (B) marking each of the modules as a second type where a parent module of the modules is marked as the first type by traversing downward through the hierarchy starting from the top module and (C) marking each of the modules as a third type where the parent module is not marked as the keep type by traversing downward through the hierarchy starting from the top module.

The objects, features and advantages of the present invention include providing a method that may (i) improve design validation turnaround time as compared with conventional approaches, (ii) reduce a time spent in a single iteration of a target module, (iii) allow usage of a less powerful hardware for design validation, (iv) reduce iterations during test pattern validation and generation of test programs and/or (v) support simulations in other parts of a design flow.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention generally provides a novel method to improve design validation turnaround time by reducing gate-level simulation time. The gate-level simulation time reductions may be achieved by performing a selective reduction of a gate-level netlist for a circuit design. The method may identify all modules of the circuit design not involved in a simulation of a target module and may remove the unnecessary modules from the netlist. Back-annotation (e.g., timing) data may be adjusted accordingly to account for the reduced netlist. A simulator may then process a smaller netlist database than the full netlist for the circuit design.

Figure 1:
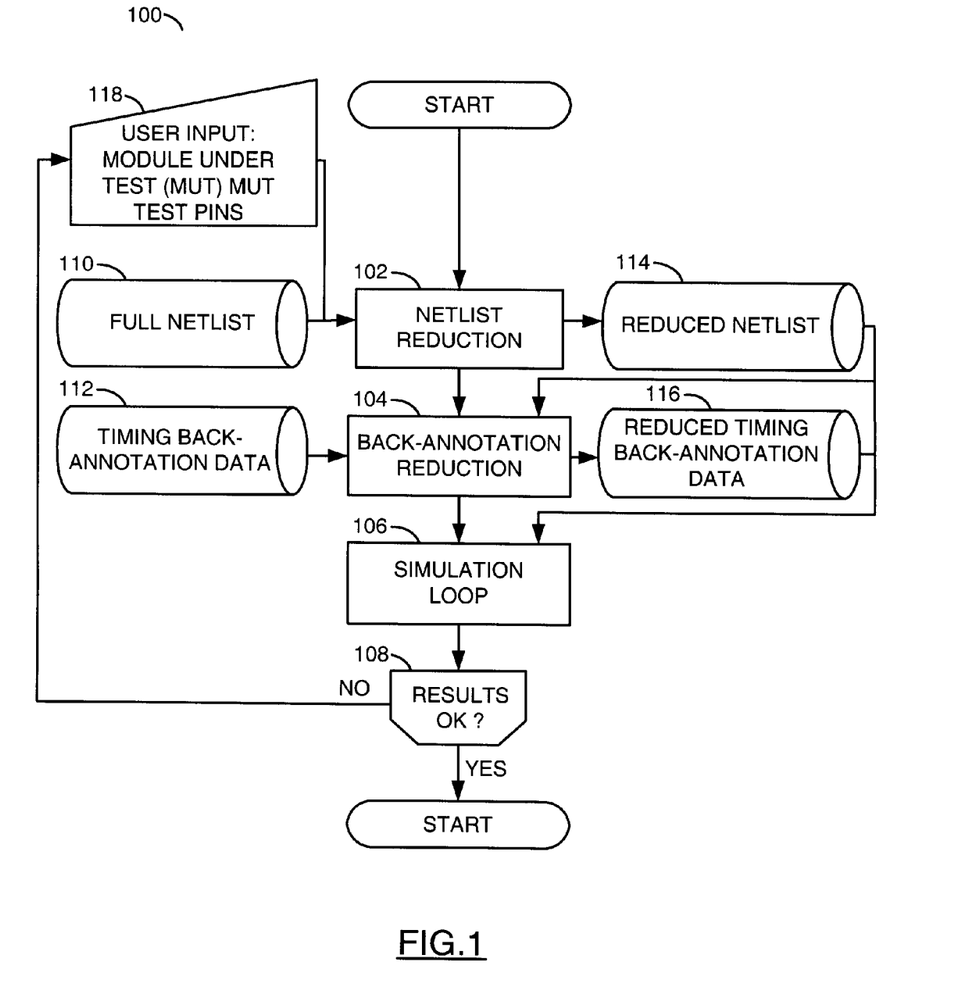
FIG. 1 is a flow diagram of an example reduction method in accordance with a preferred embodiment of the present invention.

Referring to FIG. 1, a flow diagram of an example method 100 is shown in accordance with a preferred embodiment of the present invention. The method 100 may be referred to as a reduction method or process. The reduction method 100 generally comprises a step 102, a step 104, a step 106 and a step 108. The reduction method 100 generally operates with a data file 110, a data file 112, a data file 114, a data file 116 and a user input 118.

The data file 110 may be referred to as a netlist file. The netlist file 110 may provide information for a full netlist of a circuit design to the step 102. The full netlist may be configured in a hierarchical tree arrangement. The full netlist may define the circuit design to a gate-level and a node level.

The data file 112 may be referred to as a timing file. The timing file 112 may provide back-annotation data for the circuit design to the step 104. The back-annotation data generally comprises timing data for the circuit design. The timing data may be generated based on the full netlist.

The data file 114 may be referred to as a reduced netlist file. The reduced netlist file 114 may be operational to hold a portion of the full netlist as determined by the step 102. The portion may be referred to as a reduced netlist. The reduced netlist may be provided to the step 104 and the step 106.

The data file 116 may be referred to as a reduced timing file. The reduced timing file 116 may be operational to hold a portion of the back-annotation data as determined by the step 104. The portion may be referred to as reduced timing back-annotation data. The reduced timing back-annotation data may be provided to the step 106.

The user input 118 may be operational to convey user information into the reduction method 100. The user input 118 generally provides the user information to the step 102. The user information may be received in a form of one or more lists. The user information may include, but is not limited to, (i) an identification of one or more target modules to be tested/simulated and (ii) associated test pins used for stimulation and observation. The list of test pins generally defines input/output ports for the target modules used during simulation. Hereafter, each target module may also be referred to as a module under test (MUT).

The reduction method 100 generally begins with step 102. The step 102 may be operational to reduce a size (e.g., gate count) of the full netlist stored in the netlist file 110. The gate-level netlist is generally processed according to the user information received from the user input 118. The modules to be simplified and/or removed may be identified and the reduced netlist may be generated. Upon completion, the step 102 may transfer the reduced netlist to the reduced netlist file 114 for temporary storage. The netlist reduction generally (i) keeps all of the modules (e.g., objects) with which the target modules interact (e.g., influences) and (ii) discards the modules that do not interact with or influence the target modules either directly or indirectly.

The step 104 may operate on the timing back-annotation data received from the timing file 112. The step 104 may generate the reduced timing back-annotation data based upon the reduced netlist. Timing information relevant to removed modules may be eliminated. The reduced back-annotation data may be transferred to the reduced timing file 116 for temporary storage.

The timing file 112 may be compliant with a Standard Delay Format (SDF) specification. The back-annotation data within the timing file 112 is generally modified by the step 104 for consistency with the reduced netlist. Data belonging to black-boxed and ignored (e.g., skipped) modules is generally removed from the timing data. The back-annotation reduction step 104 generally works according to the following parameters: (i) cell delay data may be kept if the cell belongs to a kept module and (ii) interconnect delay data may be kept if both starting and ending points belong to kept modules. If only the starting or ending points belong to a kept module, the data may be skipped since the path may not be exercised by the simulation.

Simulation may be performed on the circuit design at step 106 using only the reduced netlist and the reduced timing back-annotation data. The simulation generally executes faster than in conventional approaches since only a fraction of the full netlist is simulated. If the results generated by the simulation are acceptable to the user (e.g., the YES branch of step 108), the reduction method 100 may be completed. If the results are unacceptable to the user (e.g., the NO branch of step 108), the user input 118 may be adjusted and the reduction method 100 performed again. The resulting simulation loop is generally iterated until the appropriate simulation results are obtained.

The reduction method 100 may be particularly efficient if each MUT is stimulated and observed directly from primary chip inputs and/or outputs. Internal test points (e.g., internal interfaces) may also be used for inserting data into the simulated circuit design and reading therefrom. An application where the reduction method 100 is particularly suitable may be a validation of a test program that addresses a specific unit of an ASIC circuit design, such as a logic-BIST pattern for an IP-block and a memory-BIST pattern for a specific set of memories. In such cases, the target module is generally controlled and observed via a set of test ports that may connect a limited number of test modules to the primary input/output interfaces of a chip or integrated circuit.

The reduction method 100 may also be useful in situations where a test program is debugged at a top level of a chip (e.g., a case where several simulation iterations may be performed.) Using a reduced netlist generally allows a reduction in the time spent in a single iteration and may also allow use of less powerful hardware resources for the calculations. The reduction method 100 may be particularly beneficial with prototype evaluations where fast turnaround time may be important Referring to FIG. 2, a flow diagram of an example implementation of the netlist reduction step 102 is shown. The netlist reduction step (or process) 102 generally comprises a step 120, a step 122, a step 124, a step 126, a step 127, a step 128, a step 130, a step 132 and a step 134. The step 102 may receive the full netlist from the netlist file 110. The step 122 may receive the user information from the user input 118. The step 134 may write the reduced netlist to the reduced netlist file 114.

Figure 2:
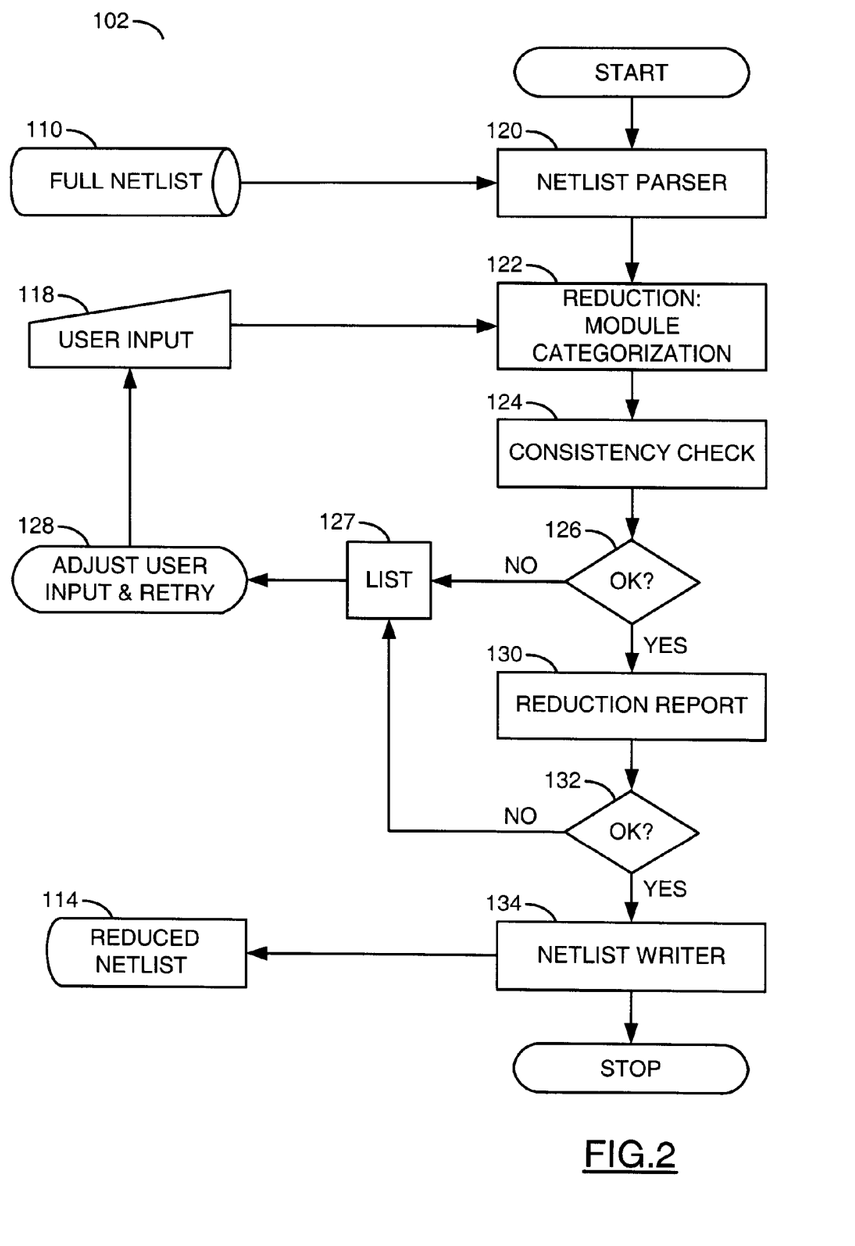
FIG. 2 is a flow diagram of an example implementation of a netlist reduction method.

The full netlist may be parsed into multiple sub-netlists (or module netlists) according to a hierarchy of modules for the circuit design by the step 120. The parsed netlist may then be processed according to the user information by the step 122. The step 122 may be referred to as a module categorization step., The purpose of module categorization step 122 may be to identify which modules may be removed and which modules may be treated as black-boxed.

Upon entry of the netlist reduction step 102, each module may be assigned an attribute of "unknown" type. An unknown type of module generally means that the corresponding module has not yet been analyzed. At the end of step 120, each module of the circuit design may have received or marked with one of the following attributes (i) a "keep" type generally indicating that the full module netlist may be written in the reduced netlist, (ii) a "black box" type generally indicating that the module may be written into the reduced netlist as a black box, and (iii) an "ignore" type of module that may be skipped (e.g., not written in the reduced netlist). A black boxed module is generally an empty version of the module containing only the information related to the external ports of the module and directions of the ports (e.g., input and/or output).

When categorization is completed, a consistency check may be performed at the step 124. The consistency check generally determines if the MUT test input/output ports are accessible in the reduced netlist. Accessibility to the MUT test input/output ports generally indicates that the MUT may be properly stimulated and observed in the reduced netlist. If the consistency check fails (e.g., the NO branch of step 126), the netlist reduction process or step 102 may return a list of potential MUTs with the associated test pins that may be added to the user list. The user may then adjust the user information at step 128 and re-enter the user list into the step 122.

The consistency step 124 generally ensures that the target MUTs may be properly simulated in the reduced netlist. The consistency step 124 may include a sub-step that performs a back-trace analysis on each MUT test input pin (or node). Each test input pin may be considered accessible for simulation if (i) driven directly by a primary input of the circuit design, (ii) driven by a primary input that crosses another keep type module either via combinatorial logic and/or via a feed-through path or (iii) driven by an output of a sequential module among the modules marked as the keep type.

The consistency step 124 may include a sub-step that performs a forward-trace analysis on each MUT test output pin (or node). An output pin may be considered observable or measurable upon (i) reaching a primary output of the circuit either directly or indirectly by crossing through a kept module along a feed-through path, (ii) reaching a primary output crossing a kept module via combinatorial circuitry or as a feed-through or (iii) reaching an input pin or node of a sequential module among the modules marked as the keep type.

If the consistency check is successful (e.g., the YES branch of step 126), a reduction report may be produced in human readable form by step 130. The reduction report generally provides information on a number of skipped/black-boxed modules and a corresponding gate-count reduction. If the user is satisfied with the results (e.g., the YES branch of step 132), the step 134 may proceed to generate and transfer a reduced netlist to the reduced netlist file 114. The reduced netlist generally comprises (i) kept modules written unaltered and (ii) black-boxed modules written as an empty version of the actual module. Modules labeled as the ignored type may be skipped (e.g., not written into the reduced netlist). As such, the reduced netlist may contain significantly fewer gates and nodes than the original full netlist.

If the user is not satisfied with the reduction results (e.g., the NO branch of step 132), a list of black-boxed modules crossed during the analysis may be generated by the step 127. The user may revisit and adjust the user information at step 128 in order to achieve a better result. Generally, the netlist reduction process 102 may be reiterated using an updated user list as a source of additional MUTs.

Figure 3:
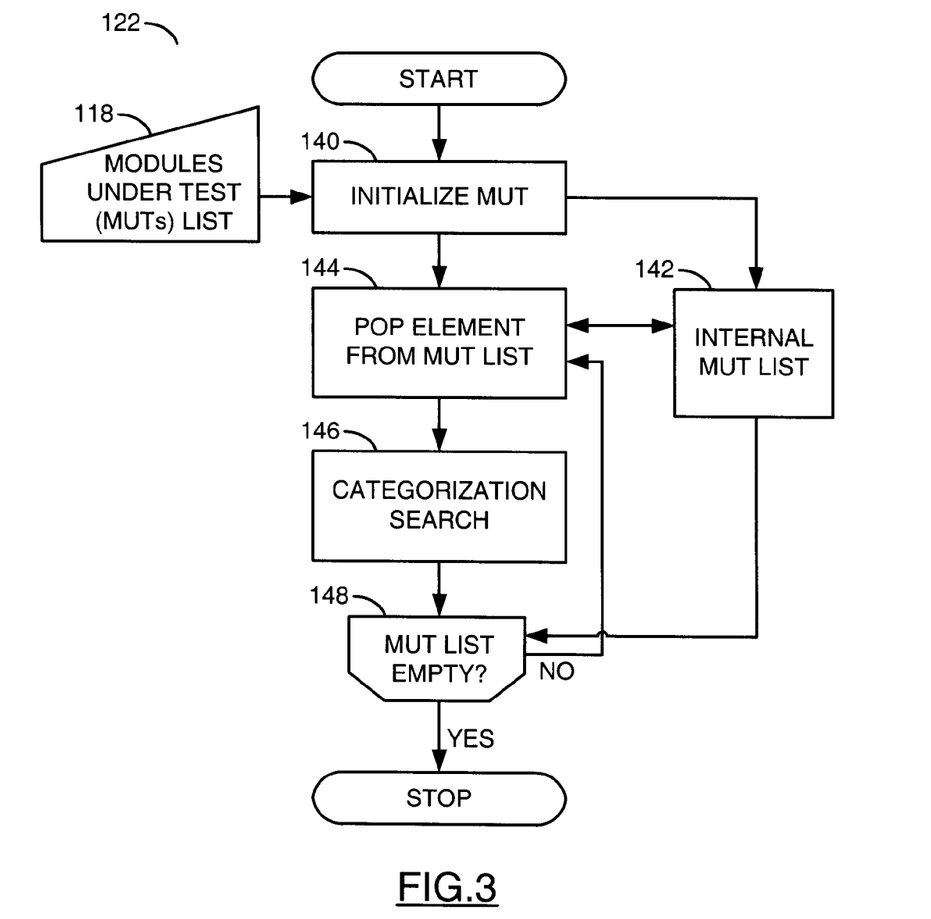
FIG. 3 is a flow diagram of an example implementation of a module categorization method.

Referring to FIG. 3, a flow diagram of an example implementation of the module categorization step 122 is shown. The module categorization step (or process) 122 may analyze each MUT in the user list and corresponding attributes for the modules may be set accordingly. The module categorization process 122 generally comprises a step 140, a buffer 142, a step 144, a step 146 and a step 148. The MUT list from the user input 118 may be received by the step 140.

All of the MUTs received from the user list may be initialized in the step 140 by marking the modules as "unchecked." An unchecked marking generally indicates that the corresponding module has not yet been analyzed. The process 122 may generate and store an internal MUT list of the MUTs in the buffer 142.

Each MUT in the internal MUT list may be popped or removed from the buffer 142, one at a time, by the step 144. All of the modules in the circuit design hierarchy may be categorized using the just-popped MUT as a starting point in the step 146. The step 146 may be referred to as a categorization search step. A check may be made at the step 148 after each categorization to determine if any additional MUTs in the internal MUT list remain to be analyzed. If one or more MUTs remain unchecked (e.g., the NO branch of step 148), the module categorization process 122 may return to the step 144 to pop the next MUT from the internal MUT list. If all of the MUTs in the internal MUT list have been considered (e.g., the YES branch of step 148), the module categorization process 122 may be ended.

Figure 4:
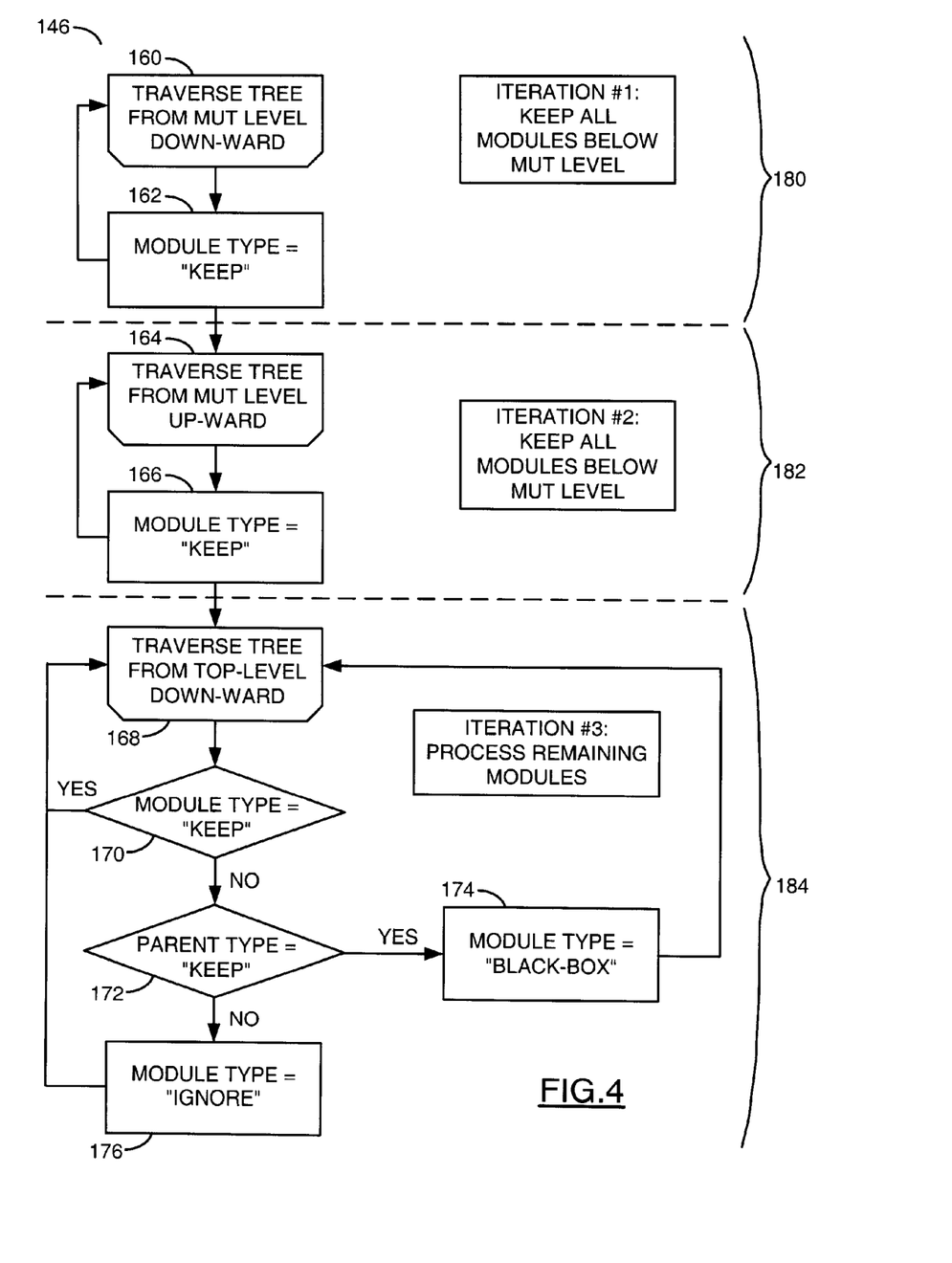
FIG. 4 is a flow diagram of an example implementation of the categorization search method.

Referring to FIG. 4, a flow diagram of an example implementation of the categorization search step 146 is shown. The categorization search step (or process) 146 may include identifying and marking the MUT and the modules below the MUT to be simulated in full form (e.g., no module netlist reduction). The process 146 may also identify and mark all modules above the MUT for simulation in full form. The modules above the MUT may contain instances of non-MUT modules. The non-MUT modules may be identified and marked as black-box modules to maintain consistency in the reduced netlist database. Modules below each black-boxed module may be identified and marked as ignored since no further instantiation are provided.

The categorization search process 146 generally comprises a step 160, a step 162, a step 164, a step 166, a step 168, a step 170, a step 172, a step 174 and a step 176. The steps 160 through 176 may be logically associated with three iterations (or passes) 180, 182 and 184. The iteration 182 may follow a completion of the iteration 180. The iteration 184 may follow a completion of the iteration 182.

The first iteration 180 generally marks all of the modules in the circuit design hierarchy below the current MUT as the keep type. The step 160 may traverse the hierarchy tree starting with the current MUT and search down a branch of the tree for other modules below the current MUT. The step 162 may mark the current MUT and each module below the current MUT along the searched branch with the keep type.

The steps 160 and 162 may be repeated for each branch below the current MUT. Once all paths below the current MUT have been searched, the first iteration step 180 may be completed.

The second iteration 182 generally marks all of the modules above the current MUT as the keep type. The step 160 may traverse the hierarchy tree starting with the current MUT and search up a branch of the tree for other modules. The step 166 may mark each module above the current MUT along the searched branch with the keep type. The steps 164 and 166 may be repeated for each branch above the current MUT. Once all paths leading upward from the current MUT have been searched, the second iteration step 182 may be completed.

The third iteration 184 generally marks all remaining modules as either the black-box type or the ignore type. The third iteration 184 generally does not mark any additional modules as the keep type. The step 168 may traverse each branch of the hierarchy tree downward starting from a top module in the hierarchy. A type for each module along each branch may be examined by the step 170. If the module being examined is already marked as the keep type (e.g., the YES branch of the step 170), the third iteration 184 may continue to search down sub-branches below the current module just examined.

If the current module being examined is not marked as the keep type (e.g., the NO branch of step 170), the type for each parent module above the currently examined module may be checked by the step 172. If any parent module is the keep type (e.g., the YES branch of step 174), the current child module under examination may be marked as the black-box type by the step 174. The third iteration 184 may then continue down the sub-branches below the current module.

If none of the parent modules to the currently examined module is labeled as the keep type (e.g., the NO branch of step 172), the currently examined module may be marked as the ignored type by the step 176. The third iteration 184 may then continue searching the sub-branches below the current module. Once a bottom module for any branch and/or sub-branch has been reached, the third iteration process 184 may continue searching along other branches and sub-branches until all of the modules have been checked and categorized. The categorization search process 146 generally concludes when none of the modules are of the unknown type.

Figure 5:
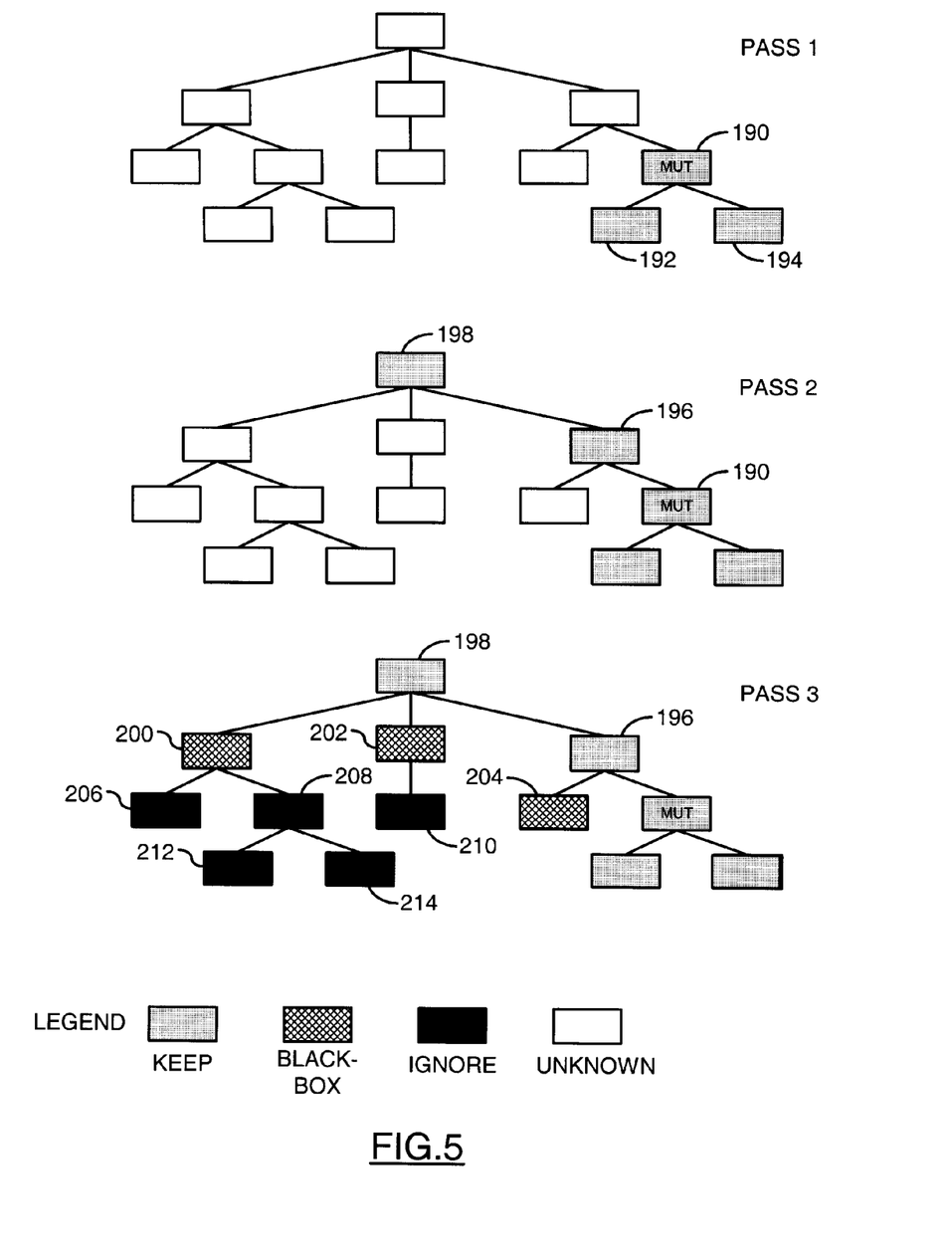
FIG. 5 is an example hierarchy tree illustrating operations of the categorization search method.

Referring to FIG. 5, an example hierarchy tree illustrating operations of the categorization search process 146 is shown. In a first pass (e.g., the first iteration 180), a current MUT 190 from the user list and two modules 192 and 194 below the current MUT 190 may be identified as keep type modules. In a second pass (e.g., the second iterations 182), each module 196 and 198 above the current module 190 may also be identified as keep type modules. In a third pass (e.g., the third iterations 184), each path downward from the top module 198 may be searched. Each unknown module along the paths may be categorized as either black-box types and/or ignore types. For example, each module 200, 202 and 204 may be marked as the black-box type since the parent modules 198, 198 and 196, respectively, may be marked as kept. The remaining modules 206, 208, 210, 212 and 214 may be identified as the ignored type.

Figure 6:
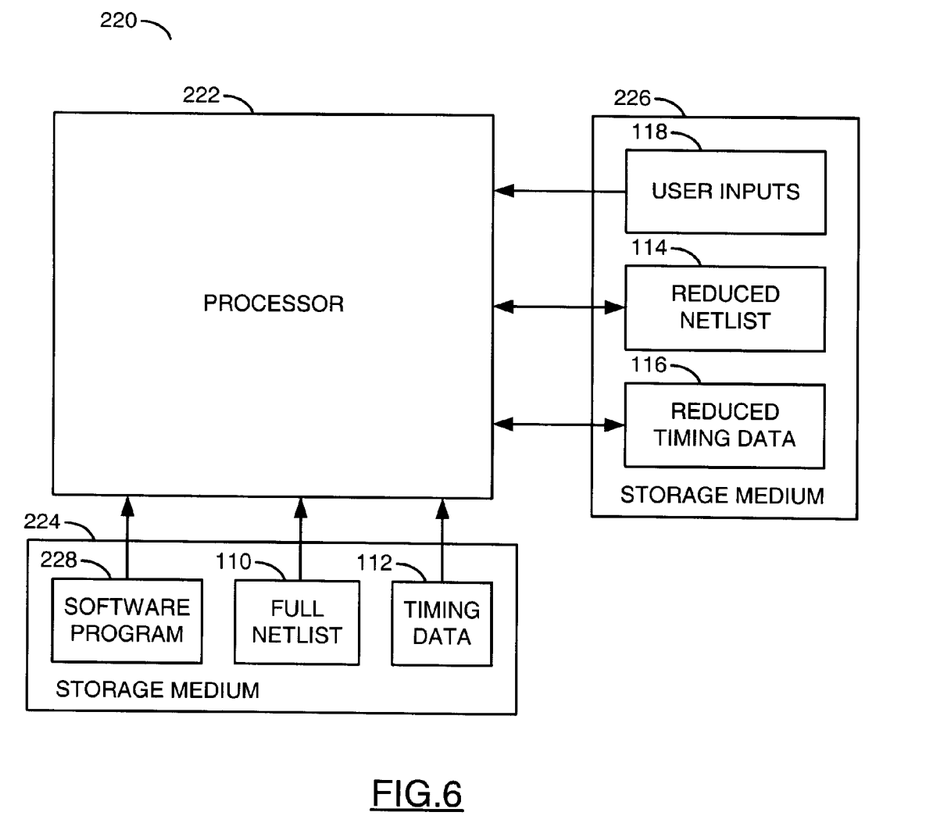
FIG. 6 is a block diagram of an example system operational to perform the reduction method.

Referring to FIG. 6, a block diagram of an example system 220 operational to perform the reduction method 100 is shown. The system 220 generally comprises a processor 222, a storage medium 224 and a storage medium 226. The storage medium 224 may be implemented as a mass storage device such as a hard disk, optical disk, magnetic tape or the like. The storage medium 226 may be implemented as a random access memory or other technology suitable for rapid communication with the processor 222.

The storage medium 224 may store a software program 228 implementing the reduction method 100. The software program 228 may be transferrable to and executable by the processor 222. The storage medium 224 may also store the full netlist file 110 and the timing file 112. In one embodiment, the software program 228 may be stored in a storage medium separate from the files 110 and/or 112. The storage medium 226 may store the user input 118, the reduced netlist file 114 and the reduced timing file 116.

The present invention may be applied while performing a sign-off for a large ASIC design. The present invention was applied for simulating a BIST pattern on a known sample design to determine an example level of netlist reduction. The sample design was for a core module of a chip design and excluded the input/output ring and boundary scan logic. Results of a functional simulation with timing data previously existed and thus the back-annotation reduction step 104 was not performed prior to the reduced netlist simulation. Data collected with and without applying the present invention to the sample design is generally illustrated in TABLE I as follows:

TABLE I

| Parameter | Value |
| --- | --- |
| Netlist reduction | >90% |
| CPU simulation time with complete netlist | approximately 8 hours |
| CPU simulation time with reduced netlist | approximately 1 hour |

The reduction method 100 generally has several advantages versus a simple hierarchical design approach where subsections of the entire design are isolated and simulated. The reduction method 100 may reduce a size of the full netlist in terms of gate count. Therefore, the hardware criteria (e.g., processor speed, memory space and swap space) for simulating the reduced netlist may be at least one order of magnitude smaller than simulating the full netlist. Furthermore, tests have shown that eight simulation iterations with reduced netlist may take the same time as a single iteration with the complete netlist.

The reduction method 100 may be targeted for a sign-off simulation phase in a development cycle of a circuit design. In the sample application, the reduction method 100 was generally shown to be effective in reducing iterations during test pattern validation and generation of test programs. The method 100 may also be extended to support simulation in other parts of the design flow. In general, the method 100 is efficient for simulations under one or more of the following conditions: (i) an easily identifiable subsection of the design (e.g., a specific set of target modules) and (ii) the target modules may be stimulated directly or via a reduced number of modules.

The functions performed by the flow diagrams of FIGS. 1-5 may be implemented using a conventional general purpose digital computer programmed according to the teachings of the present specification, as will be apparent to those skilled in the relevant art(s). Appropriate software coding may readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which may be used to program a computer to perform a process in accordance with the present invention. The storage medium may include, but is not limited to, any type of disk including floppy disk, optical disk, CD-ROM, and magneto-optical disks, ROMS, RAMS, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for analyzing a circuit design in preparation for a simulation, comprising the steps of:
   (A) marking in a memory each of a plurality of modules between a target module of said modules and a top module of said modules inclusively in a hierarchy of said circuit design as a first type by traversing upward in said hierarchy starting from said target module;
   (B) marking in said memory each of said modules as a second type where a parent module of said modules is marked as said first type by traversing downward in said hierarchy starting from said top module;
   (C) marking in said memory each of said modules as a third type where said parent module is marked as one of (i) said second type and (ii) said third type by traversing downward in said hierarchy starting from said top module; and
   (D) generating a netlist of said circuit design in said memory, wherein (i) said first type designates said simulation in a full form, (ii) said second type designates said simulation in a black-box form and (iii) said third type designates a non-simulation form.

2. The method according to claim 1, further comprising the step of:
   initializing each of said modules as a fourth type indicating no analysis prior to step (A).

3. The method according to claim 1, further comprising the step of:
   reducing a portion of said netlist of said circuit design corresponding to each of said modules marked as said second type to a black-box representation.

4. The method according to claim 3, wherein said black-box representation is limited to a plurality of external ports.

5. The method according to claim 1, further comprising the step of:
   eliminating a portion of said netlist of said circuit design corresponding to each of said modules marked as said third type.

6. A storage medium for use in a computer, said storage medium recording a computer program, when executed said computer program comprising the steps of:
   (A) marking in a memory each of a plurality of modules between a target module of said modules and a top module of said modules inclusively in a hierarchy of a circuit design as a first type by traversing upward in said hierarchy starting from said target module;
   (B) marking in said memory each of said modules as a second type where a parent module of said modules is marked as said first type by traversing downward in said hierarchy starting from said top module;

(C) marking in said memory each of said modules as a third type where said parent module is marked as one of (i) said second type and (ii) said third type by traversing downward in said hierarchy starting from said top module; and (D) generating a netlist of said circuit design in said memory, wherein (i) said first type designates a simulation in a full form, (ii) said second type designates said simulation in a black-box form and (iii) said third type designates a non-simulation form.

7. A method for reducing a full netlist of a circuit design in preparation for simulation, comprising the steps of:

(A) generating a plurality of module netlists by parsing said full netlist among a plurality of modules in a hierarchy of said circuit design with a processor;

(B) categorizing in a memory all of said modules as not analyzed;

(C) categorizing in said memory a first one or more of said modules as a first type simulated in a full form;

(D) categorizing in said memory a second one or more of said modules as a second type simulated in a black-box form;

(E) categorizing in said memory a third one or more of said modules as a third type not simulated where a parent module is one of (i) said second type and (ii) said third type by traversing downward in said hierarchy starting from a top module; and (F) reducing each of said module netlists corresponding to said second type in said memory to said black-box form with said processor.

8. The method according to claim 7, further comprising the step of:

generating a reduced netlist from each of said module netlists corresponding only to said first type and said second type after said reducing.

9. The method according to claim 7, further comprising the step of:

checking at least one input and at least one output of a target module of said modules having said first type to identify access to both stimulate and observe said target module during said simulation.

10. The method according to claim 7, further comprising the step of:

generating a report having in human readable form (i) a first number of gates of said modules having (a) said second type and (b) said third type that were reduced from said full netlist, (ii) a second number of said modules having said second type and (iii) a third number of said modules having said third type.

11. The method according to claim 7, further comprising the steps of:

popping an initial module of said modules from a list of said modules being simulated; and categorizing said modules in said list based on said initial module.

12. The method according to claim 11, further comprising the step of:

repeatedly (i) popping a subsequent module of said modules from said list and (ii) categorizing said modules in said list based on said subsequent module until all of said modules from said list have been considered.

13. The method according to claim 7, wherein said black-box form is limited to a plurality of external ports.

14. A storage medium for use in a computer, said storage medium recording a computer program, when executed said computer program comprising the steps of:

(A) generating a plurality of module netlists by parsing a full netlist among a plurality of modules in a hierarchy of a circuit design;

(B) categorizing all of said modules as not analyzed;

(C) categorizing a first one or more of said modules as a first type simulated in a full form;

(D) categorizing a second one or more of said modules as a second type simulated in a black-box form;

(E) categorizing a third one or more of said modules as a third type not simulated where a parent module is one of (i) said second type and (ii) said third type by traversing downward in said hierarchy starting from a top module; and (F) reducing each of said module netlists corresponding to said second type to said black-box form.

15. A method for preparing a circuit design for a simulation, comprising the steps of:

(A) categorizing in a memory a first one or more of a plurality of modules of said circuit design as a first type simulated in a full form;

(B) categorizing in said memory a second one or more of said modules as a second type influencing said first type during said simulation;

(C) categorizing in said memory a third one or more of said modules as a third type not influencing said first type during said simulation where a corresponding parent module of each of said third modules is one of (i) said second type and (ii) said third type;

(D) reducing in said memory a full netlist of said circuit design by eliminating said modules having said third type; and (E) reducing in said memory said full netlist by representing said modules having said second type in a black-box form limited to a plurality of external ports.

16. The method according to claim 15, further comprising the step of:

generating a reduced timing database from a full timing database of said circuit design by eliminating timing information corresponding to each of said modules marked as said third type.

17. The method according to claim 16, further comprising the step of:

simulating said circuit design using only said modules marked as said first type and said second type.

18. The method according to claim 15, further comprising the step of:

receiving a user input identifying a target module of said modules used as a basis of said reduction of said full netlist.

19. The method according to claim 15, wherein step (A) comprises the sub-steps of:

initializing said modules to a fourth type indicating no categorization;

popping an initial module of said modules from a list of said modules being simulated; and categorizing said modules in said list based on said initial module.

20. The method according to claim 15, further comprising the step:

initializing said modules to a fourth type indicating no categorization prior to step (A).

21. A storage medium for use in a computer, said storage medium recording a computer program, when executed said computer program comprising the steps of:
- (A) categorizing a first one or more of a plurality of modules of a circuit design as a first type simulated in a full form;
- (B) categorizing a second one or more of said modules as a second type influencing said first type during a simulation;
- (C) categorizing a third one or more of said modules as a third type not influencing said first type during said simulation where a corresponding parent module of each of said third modules is one of (i) said second type and (ii) said third type;
- (D) reducing a full netlist of said circuit design by eliminating said modules having said third type; and
- (E) reducing said full netlist by representing said modules having said second type in a black-box form limited to a plurality of external ports.

* * * * *